United States Patent [19]

Shelton et al.

[11] Patent Number: 4,965,517
[45] Date of Patent: Oct. 23, 1990

[54] FLUX CONCENTRATOR FOR MAGNETIC SENSORS

[75] Inventors: Randolph A. Shelton; Robert E. Weber, both of Newport News, Va.

[73] Assignee: Siemens-Bendix Automotive Electronics L.P., Troy, Mich.

[21] Appl. No.: 396,593

[22] Filed: Aug. 21, 1989

[51] Int. Cl.$^5$ ............................................. G01R 33/06
[52] U.S. Cl. .................................... 324/174; 338/32 H; 324/207.20
[58] Field of Search ............... 324/200, 173, 207.20, 324/207.21, 207.11, 207.15, 235, 236, 228, 225, 226, 251, 174; 338/32 R, 32 H

[56] References Cited

U.S. PATENT DOCUMENTS 3,225,293 12/1965 Wood et al. ........................ 324/221
4,555,120 11/1985 Frait et al. ..................... 324/207.2 X
4,674,892  3/1987 Hewitt ............................. 324/243 X
4,694,247  9/1987 Meili et al. ...................... 324/262 X
4,803,426  2/1989 Odagawa et al. ............... 324/207.20
4,916,394  4/1990 Thompson ....................... 324/242 X Primary Examiner—Ernest F. Karlsen
Assistant Examiner—Warren S. Edmonds
Attorney, Agent, or Firm—George L. Boller; Russel C. Wells

[57] ABSTRACT

A wheel speed sensor comprises a Hall device disposed in a pocket in a cavity of a plastic housing. The cavity is filled with potting compound to capture and enclose the Hall device. Flux issued from a magnet that rotates with the wheel acts upon the Hall device and is concentrated on the Hall device by ferromagnetic fragments interspersed throughout the potting compound.

9 Claims, 1 Drawing Sheet

FLUX CONCENTRATOR FOR MAGNETIC SENSORS

BACKGROUND AND SUMMARY OF THE INVENTION

This invention relates to an improvement in a magnetic wheel speed sensor.

Magnetic wheel speed sensors are utilized in automotive vehicle wheels to provide electrical signals representing wheel speed. In a typical system, a magnet that is polarized at regular circumferential intervals rotates with the wheel. The magnetic flux issued by the magnet acts upon a sensor, such as a Hall device, that is mounted stationarily adjacent the wheel. As the wheel rotates, the magnetic flux passing through the sensor is caused to vary and as a result the sensor produces a similarly varying electrical output signal. It is only a certain fraction of the flux that actually acts upon the sensor because the remainder of the flux goes astray.

A Hall device is responsive to the intensity of the magnetic flux passing through it, and therefore in a wheel speed sensing system there must be a suitable flux intensity acting upon the device in order for the device to produce a suitable output signal. Accordingly, the magnetomotive force of the magnet, the clearance between the magnet and the Hall device, and the ability to concentrate the flux onto the device are important factors in assuring that a suitable output signal can be developed. The closer the Hall device is to the magnet, the larger the magnetic flux acting on the device; the greater the magnetomotive force of the magnet, the greater the magnetic flux acting on the device. Unfortunately, part manufacturing tolerances limit how small the running clearance between the magnet and the Hall device can be, and more powerful magnets are more costly.

The present invention relates to an improvement for concentrating the magnetic flux on the Hall device while still providing a construction for the sensor that is conducive to economy in manufacture and to satisfactory life and performance in use. Explained in a different way, the invention either makes the running clearance between the magnet and the Hall device less critical for a given magnet strength or else makes the magnet strength less critical for a given running clearance between the magnet and the Hall device.

According to principles of the invention, the sensor is constructed of a magnetically non-conductive housing having a cavity containing a pocket within which the Hall device is disposed. The device is captured within the pocket by means of a potting compound disposed within the housing cavity. Interspersed throughout the potting compound are fragments of magnetically conductive material, such as ferromagnetic filings, chips, powder, flakes, or the like. Such material aids in concentrating the magnetic flux on the Hall device.

The foregoing features, advantages, and benefits of the invention, along with additional ones, will be seen in the following detailed description. Drawings accompany the description and illustrate a preferred embodiment according to the best mode contemplated at the present time for carrying out the invention.

DESCRIPTION OF THE PREFERRED EMBODIMENT

Figure 1:
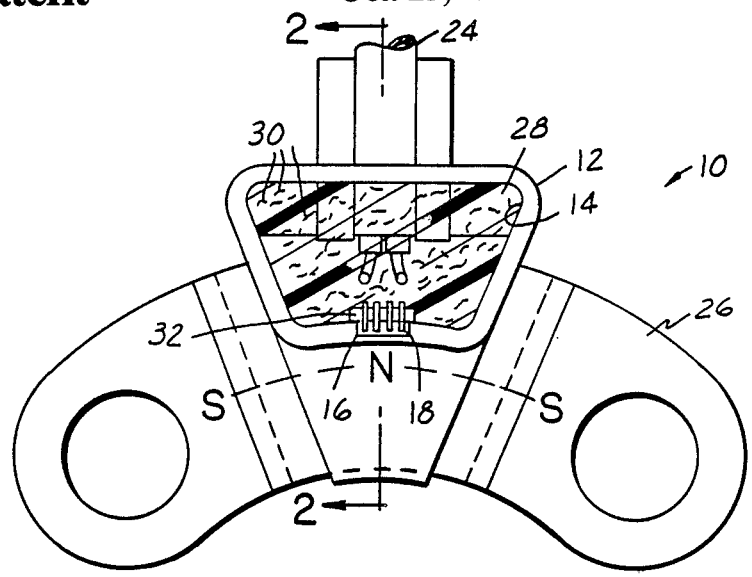
FIG. 1 is a plan view of a sensor embodying principles of the invention.
Figure 2:
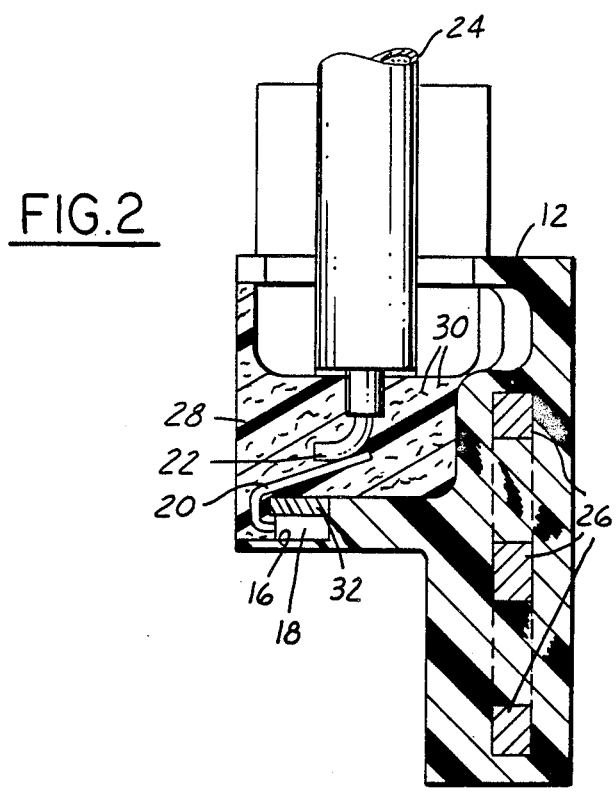
FIG. 2 is a cross sectional view taken in the direction of arrows 2—2 in FIG. 1.

The wheel speed sensor 10 comprises a plastic housing 12 containing a cavity 14. The radially inner wall of the housing has a small rectangular pocket 16 that is contiguous with cavity 14. A Hall device 18, whose body is of generally rectangular shape, fits closely within pocket 16. The Hall device has terminations 20 shaped to make connection to wires 22 of a sheathed electric cable 24 that terminates within cavity 14 after having passed through the radially outer wall of housing 12.

A metal backing plate 26 for mounting the sensor stationarily on an automotive vehicle adjacent a wheel is joined with housing 12 in a secure and permanent manner. When the sensor is so mounted, it is disposed radially outwardly of a part of the wheel that contains an annular magnet which is magnetically polarized at regular circumferential intervals. The magnet is represented diagrammatically in FIG. 1 by a partial showing of the alternating north and south poles, N and S.

As the wheel rotates, an alternating magnetic flux is imposed on Hall device 18, and the Hall device generates a corresponding output signal that is delivered via cable 24 to a conventional circuit into which the Hall device is connected.

In accordance with principles of the invention, the Hall device is captured within pocket 16, and enclosed, by means of a conventional potting compound 28 having thermal characteristics compatible with the material of housing 12. The potting compound however contains ferromagnetic fragments 30 interspersed throughout. It is these fragments that aid in concentrating the magnetic flux toward Hall device 18. As an additional aid, a flat ferromagnetic concentrator piece 32 is disposed flat against the back surface of the Hall device's body. As can be seen in the drawings, the potting compound also encapsulates the concentrator piece as well as the terminations 20 and that portion of cable 24 that is within cavity 14. The assembled parts are thereby held and protected in a secure and permanent manner. The sensor possesses the advantages and benefits that were enumerated earlier. The ferromagnetic fragments are, of course, mixed into the potting compound prior to filling the housing cavity with the mixture.

While a preferred embodiment of the invention has been disclosed, it is to be understood that principles are applicable to other embodiments.

What is claimed is:

1. In a wheel speed sensing system comprising a magnet that is polarized at regular circumferential intervals and that rotates with the wheel, and a magnetically responsive sensor that is disposed stationarily adjacent the magnet and senses the passage of the polarized intervals of the magnet past the sensor, said sensor comprising a magnetically non-conductive housing having a cavity with a contiguous pocket, and a magnetic flux sensing element, such as a Hall device, disposed in said pocket, the improvement for both capturing the sensing element within said pocket and concentrating the magnetic flux issued by said magnet toward said sensing element, said improvement comprising a potting compound within said cavity capturing said sensing element within said pocket and a multitude of magnetically conductive fragments interspersed throughout said potting compound.

2. The improvement set forth in claim 1 including a flat magnetically conductive piece disposed flat against a flat surface of said sensing element, said piece being disposed between said flat surface of said sensing element and said potting compound.

3. The improvement set forth in claim 2 in which said piece is disposed radially outwardly of said sensing element.

4. The improvement set forth in claim 1 in which said pocket is at a radially inner portion of said cavity and the bulk of said potting compound lies radially outwardly of said sensing element.

5. The improvement set forth in claim 4 including a flat magnetically conductive piece disposed flat against a flat surface of said sensing element, said piece being disposed between said flat surface of said sensing element and said potting compound.

6. The improvement set forth in claim 1 including an electric cable extending through a wall of said housing and having wires terminating within said cavity, said sensing element having electrical terminations joining with said wires, said potting compound encapsulating both said electrical terminations of said sensing element and that portion of said electric cable which is within said cavity.

7. For use in a wheel speed sensing system, a sensor to be disposed stationarily adjacent a magnet that is polarized at regular circumferential intervals and that rotates with the wheel, for sensing the passage of the polarized intervals of the magnet past the sensor, said sensor comprising a magnetically non-conductive housing having a cavity containing a magnetic flux sensing element, such as a Hall device, the improvement for both capturing the sensing element within said cavity and concentrating the magnetic flux issued by said magnet toward said sensing element, said improvement comprising a potting compound within said cavity capturing said sensing element within said cavity and a multitude of magnetically conductive fragments interspersed throughout said potting compound.

8. The improvement set forth in claim 7 including a flat magnetically conductive piece disposed flat against a flat surface of said sensing element, said piece being disposed between said flat surface of said sensing element and said potting compound.

9. The improvement set forth in claim 7 in which said cavity contains a contiguous pocket formed in a wall of the cavity, said sensing element being disposed in said pocket.

* * * * *